United States Patent
Drevon et al.

(10) Patent No.: US 7,180,393 B2
(45) Date of Patent: Feb. 20, 2007

(54) DEVICE WITH HYBRID MICROWAVE CIRCUITS SHIELDED BY ELASTIC CONTACT MEMBERS

(75) Inventors: Claude Drevon, Toulouse (FR); Mathieu Paillard, Muret (FR)

(73) Assignee: Alcatel, Paris (FR)

( * ) Notice: Subject to any disclaimer, the term of this patent is extended or adjusted under 35 U.S.C. 154(b) by 82 days.

(21) Appl. No.: 10/892,440

(22) Filed: Jul. 16, 2004

(65) Prior Publication Data

US 2005/0012574 A1    Jan. 20, 2005

(30) Foreign Application Priority Data

Jul. 18, 2003  (FR) ................... 03 08773

(51) Int. Cl.
*H05K 9/00*  (2006.01)
(52) U.S. Cl. .................. 333/247; 174/350; 174/377
(58) Field of Classification Search ............ 333/247; 174/350, 351, 354, 355, 362, 369, 377
See application file for complete search history.

(56) References Cited

U.S. PATENT DOCUMENTS

2002/0074140 A1    6/2002   Kuschke et al.

FOREIGN PATENT DOCUMENTS

| DE | 196 09 718 C1 | 6/1997 |
| JP | 3-268396 A | 11/1991 |
| JP | 2002-299875 A | 10/2002 |

*Primary Examiner*—Robert Pascal
*Assistant Examiner*—Kimberly E. Glenn
(74) *Attorney, Agent, or Firm*—Sughrue Mion, PLLC

(57) ABSTRACT

A hybrid microwave circuit device comprises a base provided with an external peripheral wall and at least one internal wall together delimiting at least two cavities to accommodate hybrid microwave circuits and a cover which is made of the same material as the base. The cover has an internal face fastened to the edge of the peripheral wall to provide a hermetic seal of the cavity and to establish an electrical contact with the peripheral wall. The cover comprises deformable and elastic contact members fastened to its internal face and adapted to establish an electrical contact with the edge of the internal wall.

11 Claims, 2 Drawing Sheets

DEVICE WITH HYBRID MICROWAVE CIRCUITS SHIELDED BY ELASTIC CONTACT MEMBERS

CROSS-REFERENCE TO RELATED APPLICATIONS

This application is based on French Patent Application No. 03 08 773 filed Jul. 18, 2003, the disclosure of which is hereby incorporated by reference thereto in its entirety, and the priority of which is hereby claimed under 35 U.S.C. §119.

BACKGROUND OF THE INVENTION

1. Field of the Invention

The invention relates to the field of devices incorporating hybrid microwave circuits.

2. Description of the Prior Art

The gain of hybrid microwave circuits is constantly increasing and to prevent feedback and/or oscillation phenomena the circuits must be installed in cavities that are isolated at microwave frequencies. The devices (or modules) in which they are installed therefore comprise a base provided with an external peripheral wall and at least one internal wall together delimiting at least two cavities able to accommodate hybrid microwave circuits and a cover adapted to be fastened to the edges of the walls to seal the cavities hermetically and to establish a grounding electrical contact with the walls.

To seal hermetically the whole of the hybrid circuit, the cover is welded to the external walls of the base, often by electrical welding using knurling tools or by laser welding.

As far as the internal wall is concerned, the tack-welding technique specific to closure by knurling tools provides a hermetic seal at microwave frequencies between the different cavities.

Because of the position of the internal walls, they are welded blind. Moreover, welding necessitates a wall thickness that is sufficient, firstly, to allow centering of the weld bead and, secondly, to prevent the projection of conductive balls of weld into the cavities and thus onto the hybrid circuits. This additional wall thickness is difficult to reconcile with the miniaturization and the weight reduction required in hybrid devices. Moreover, this additional wall thickness increases the length of the connections between the microwave subassemblies installed in the different cavities, which compromises the required electrical performance in microwave applications.

In an attempt to solve this problem, it has been proposed to fasten the cover to the internal wall or walls using an electrically conductive adhesive compatible with the microwave environment. However, this type of adhesive is mechanically weak, which is incompatible with the stresses that are applied to hybrid devices by the vacuum and by thermal cycling.

Placing an absorbent material in the cavities has also been proposed. However, this is only a partial solution to the problem and may compromise the reliability of some naked electronic dies of the hybrid circuits.

No prior art solution being entirely satisfactory, an object of the invention is therefore to propose an alternative solution intended to improve on this situation.

SUMMARY OF THE INVENTION

To this end the invention proposes a hybrid microwave circuit device comprising a base provided with an external peripheral wall and at least one internal wall together delimiting at least two cavities adapted to accommodate hybrid microwave circuits and a cover which is made of the same material as the base, is adapted to have an internal face fastened to the edge of the peripheral wall to provide a hermetic seal of the cavities and to establish an electrical contact with the peripheral wall, and comprises deformable and elastic contact means fastened to its internal face and adapted to establish an electrical contact with the edge of the internal wall.

The device of the invention may have other features and in particular the following features, either separately or in combination:

a base comprising a plurality of internal walls; in this case the contact means are adapted to establish an electrical contact with the edge of each internal wall;

a peripheral wall and an internal wall or walls projecting from the base;

contact means taking the form of at least one attached member, for example welded to the inside face of the cover, and comprising a first portion fastened to the internal face of the cover and extended by a deformable and elastic second portion; for example, the first portion takes the form of a strip and the second portion comprises at least two deformable and elastic blades spaced by a distance chosen as a function of the operating frequency band of the hybrid microwave circuits;

each blade has a terminal portion conformed to define a cup having a bottom adapted to come into contact with the edge of the internal wall;

each internal wall may be lower than the peripheral wall; in this case, the internal face of the cover is substantially plane at least in one region facing the cavities; alternatively, the height of each internal wall may be substantially equal to the height of the peripheral wall; in this case, the cover is conformed to define at least one housing adapted to receive the contact means; in this case, the cover may comprise the same number of housings and contact means.

The invention is particularly well adapted, although not exclusively so, to hybrid circuits operating at least in the K band of frequencies.

In the present context the K band refers not only to the Ku band, comprising receive frequencies substantially in the [13.7 GHz, 15.6 GHz] and transmit frequencies substantially in the range [10.7 GHz, 12.8 GHz], but also the Ka band, comprising receive frequencies substantially in the [27.5 GHz, 30 GHz] and transmit frequencies substantially in the range [18.2 GHz, 20.2 GHz].

The operation of the device may be extended to frequencies above the K band as a function of the distance between the blades (or fingers) that constitute the deformable portion, for example.

Other features and advantages of the invention will become apparent on examining the following detailed description and the appended drawings.

DETAILED DESCRIPTION OF THE PREFERRED EMBODIMENTS

The appended drawings constitute part of the description of the invention and may, if necessary, also contribute to the definition of the invention.

The invention proposes a hybrid microwave circuit known as a multichip module (MCM).

Figure 1:
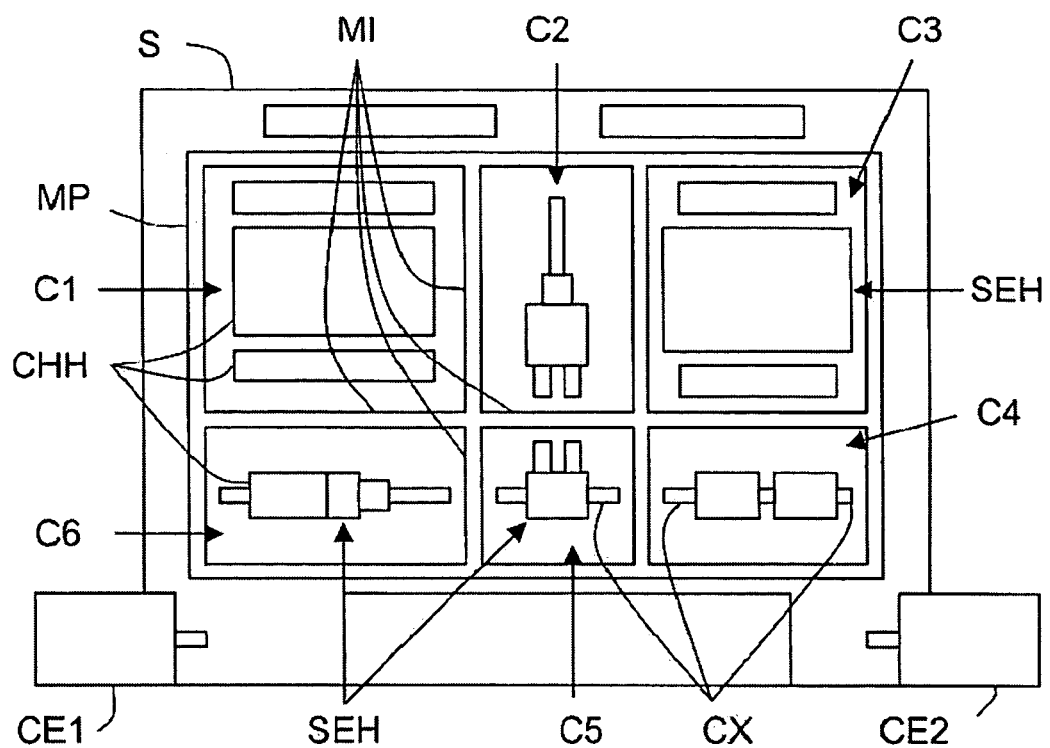
FIG. 1 shows diagrammatically in plan view one example of a base of a hybrid device of the invention.
Figure 2:
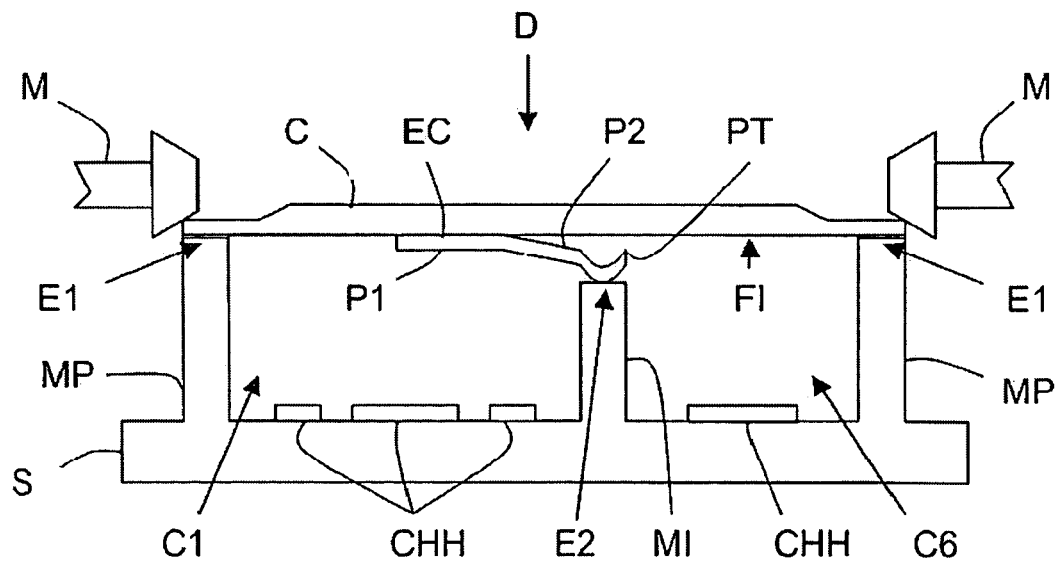
FIG. 2 shows diagrammatically in cross section a first embodiment of a hybrid device of the invention.
Figure 3:
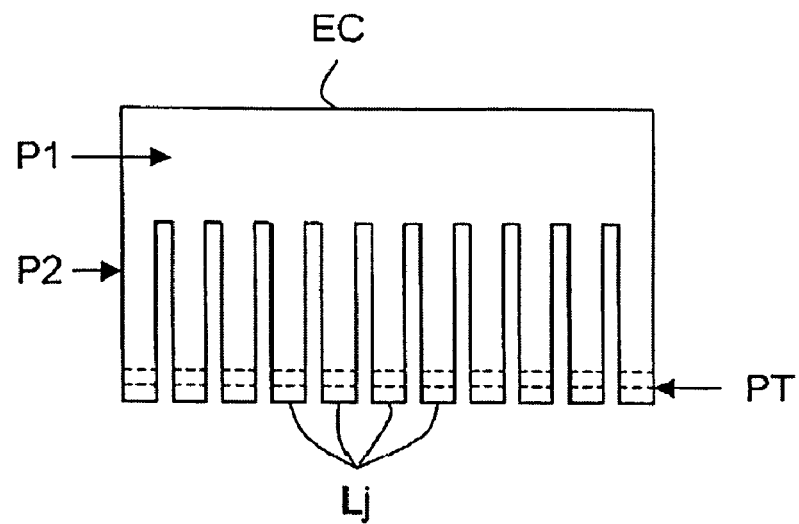
FIG. 3 shows diagrammatically in plan view one embodiment of a contact member of a hybrid device of the invention.

A first embodiment of a hybrid device (or module) according to the invention is described first with reference to FIGS. 1 to 3.

The device D comprises firstly a metal or ceramic base S (see FIG. 1) provided with an external peripheral wall MP, which is closed on itself to delimit an enclosure, and at least one internal wall Ml, which is attached to the peripheral wall MP and divides the enclosure into at least two cavities Ci. Here i is equal to six (6) but may take any value greater than or equal to two. In other words, in the embodiment shown in FIG. 1, the peripheral wall MP and the internal walls Ml together delimit six cavities C1 to C6 in which are conventionally installed hybrid subassemblies SEH each comprising at least one hybrid microwave circuit CHH. As shown here, certain hybrid subassemblies SEH may be coupled together by means of connections CX passing through the internal walls Ml. Moreover, the hybrid subassemblies SEH are connected to external connecting terminals CE1 and CE2 for connecting the hybrid device D to equipments.

The peripheral walls MP and internal walls Ml project from the base S. This kind of arrangement may be obtained in particular by machining a metal, generally Kovar® plate, or by brazing walls onto a ceramic support, of multilayer or other type, or by any other means for producing the cavities Ci.

To enable microwave shielding (or isolation) of the cavities Ci, the hybrid device D comprises a metal, generally Kovar® cover C (see FIG. 2), adapted to have its internal face FI fastened to the edge E1 of the peripheral wall MP. It is fastened by electrical welding using knurling tools M, for example. This technique hermetically seals the enclosure at microwave frequencies and establishes a grounding electrical contact between the cover C and the peripheral wall MP.

The internal face FI of the cover C comprises deformable and elastic (and therefore flexible) contact means EC to seal the cavities Ci of the enclosure hermetically at microwave frequencies and to establish a grounding electrical contact between the cover C and the internal walls Ml.

To be more precise, as shown in FIG. 2, the contact means EC are preferably attached to the internal face FI of the cover C at locations selected to establish an elastic grounding electrical connection between the cover C and each internal wall Ml.

The contact means EC are fastened to the cover C by gold-tin (Au—Sn) soldering, for example, or by electrical spot welding.

The contact means EC preferably take the form of at least one attached member having a first portion P1 fastened to the internal face FI of the cover C and extended by a deformable and elastic second portion P2. This attached member is made from an electrically conductive material such as cuproberyllium, for example.

The cover C may comprise either an attached member EC of this type or a plurality of them to provide microwave shielding of some or all of the cavities Ci.

As shown in FIG. 3, the first portion P1 of an attached member EC takes the form of a plain rectangular strip, for example, and the second portion P2, which extends this strip, takes the form of at least two deformable and elastic blades (or fingers) Lj, for example. Here, j is equal to eleven (11), but may take any value greater than or equal to two (2).

The blades Lj are particularly advantageous as they are highly elastic and able to withstand high mechanical deformations. They may therefore provide a good quality grounding electrical contact even under difficult operating conditions.

The spacing between adjacent blades Lj is chosen as a function of the operating frequency band of the hybrid microwave circuits CHH. If the cavities Ci are to be isolated from each other effectively, it is essential for this spacing to block microwaves.

The hybrid device D of the invention may therefore be used at least up to the K (Ku plus Ka) band.

As shown in FIG. 2, each blade Lj extends the strip P1 at an angle selected as a function in particular of the height of the internal wall Ml and the shape of the cover C. Moreover, the terminal portion PT of each blade Lj opposite the strip P1 is preferably conformed to define a kind of cup whose bottom is in contact with the edge E2 of the internal wall Ml concerned. This produces a contact between the blade Lj and the internal wall Ml that minimizes the risk of abrasion during relative movement of the blade Lj and the internal wall Ml.

In the embodiment shown in FIG. 2, the internal walls Ml are lower than the peripheral wall MP and the internal face FI of the cover C is substantially plane, at least in the region facing the cavities Ci. It may be otherwise, however.

Figure 4:
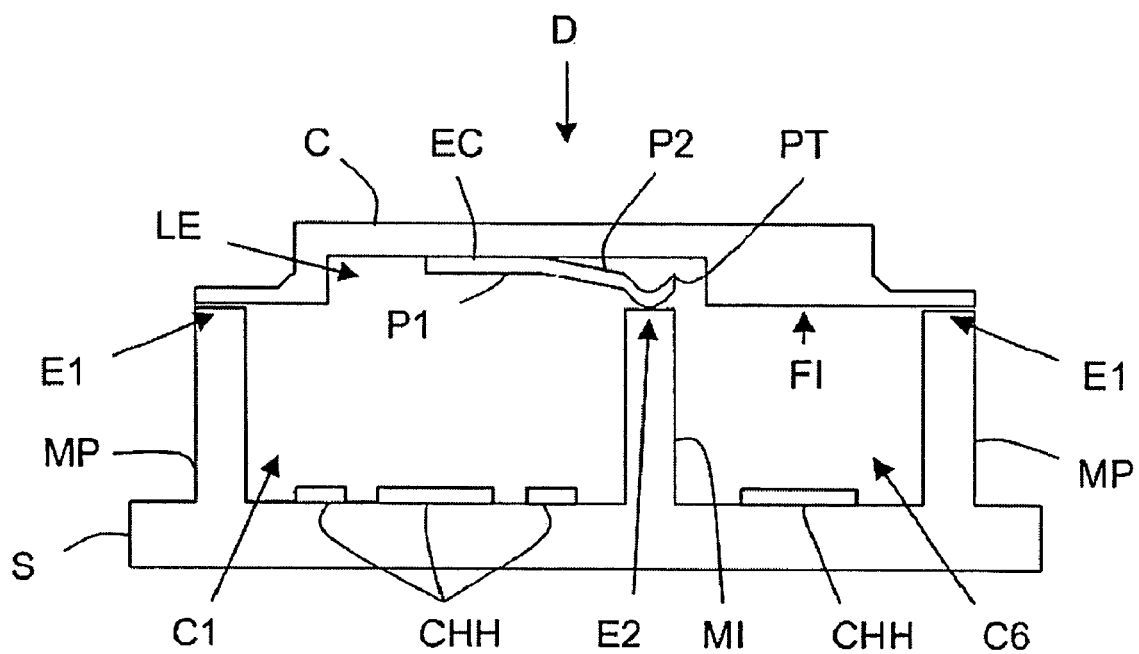
FIG. 4 shows diagrammatically in cross section a second embodiment of a hybrid device of the invention.

The invention may equally apply to conventional bases S in which the height of the internal walls Ml is substantially equal to that of the peripheral wall MP. In this case, as shown in FIG. 4, the cover C must be conformed to define at least one housing LE adapted to receive the contact means EC.

When the contact means take the form of a plurality of attached members EC of the type shown in FIG. 3, the cover C may either comprise a single housing LE receiving all the attached members EC or a plurality of housings LE each receiving at least one attached member.

The housing or housings LE may be obtained by chemically machining a metal plate defining the cover C or by any other appropriate means.

Because of the reaction force exerted by the contact means EC on the cover C, by virtue of their elasticity, it is preferable to hold the cover C tightly pressed against the edges E1 of the peripheral wall MP throughout the fastening phase.

The invention is not limited to the embodiments of the hybrid circuit described hereinabove by way of example only but encompasses all variants within the scope of the following claims that the person skilled in the art might envisage.

Thus there are described hereinabove elastic and deformable contact means taking the form of first and second portions, the latter consisting of blades (or fingers). However, any other arrangement of the contact means may be envisaged provided that they have the elasticity and the deformability to allow electrical contact between the cover and the internal walls whilst providing microwave shielding of the cavities.

There is claimed:

1. A hybrid microwave circuit device comprising: a base having an external peripheral wall and at least one internal wall, wherein the external peripheral wall and the at least one internal wall together delimitate at least two cavities adapted to accommodate hybrid microwave circuits, and a cover having an internal face including deformable elastic contact means fastened thereto which establish an electrical contact with upper edges of said at least one internal wall, wherein the cover and the base are made of the same material, and wherein the cover provides a hermetic seal of the at least two cavities, and wherein said contact means take the form of at least one attached member comprising a first portion fastened to said internal face of said cover and extended by a deformable and elastic second portion.

2. The device claimed in claim 1 wherein said contact means is adapted to establish an electrical contact with the edge of each of said at least one internal wall.

3. The device claimed in claim 1 wherein said peripheral wall and said at least one internal wall project from said base.

4. The device claimed in claim 1 wherein said first portion takes the form of a strip and said second portion comprises at least two deformable and elastic blades.

5. The device claimed in claim 4 wherein said blades are spaced by a distance chosen as a function of the operating frequency band of said hybrid microwave circuits.

6. The device claimed in claim 4 wherein each blade has a terminal portion conformed to define a cup having a bottom adapted to come into contact with the edge of said internal wall.

7. The device claimed in claim 1 wherein said contact means are fastened to said internal face of said cover.

8. The device claimed in claim 1 wherein each internal wall is lower than said peripheral wall and said internal face of said cover is substantially plane at least in one region facing said cavities.

9. The device claimed in claim 1 wherein the height of each internal wall is substantially equal to the height of said peripheral wall and said cover is conformed to define at least one housing adapted to receive said contact means.

10. The device claimed in claim 1 wherein said contact means take the form of at least one attached member comprising a first portion fastened to said internal face of said cover and extended by a deformable and elastic second portion and said cover comprises the same number of housings and contact means.

11. A method of using a hybrid microwave circuit device, comprising: providing a hybrid microwave circuit device, comprising:
    a base having an external peripheral wall and at least one internal wall, wherein the external peripheral wall and the at least one internal wall together delimitate at least two cavities adapted to accommodate hybrid microwave circuits, and
    a cover having an internal face including deformable elastic contact means fastened thereto which establish an electrical contact with upper edges of said at least one internal wall, wherein the cover and the base are made of the same material and wherein the cover provides a hermetic seal of the at least two cavities,
    wherein said contact means comprises at least one attached member comprising a first portion fastened to said internal face of said cover and extended by a deformable and elastic second portion; and
operating the hybrid microwave circuit device in a frequency band up to the K band.

* * * * *